(12) United States Patent
Argüelles et al.

(10) Patent No.: US 7,723,995 B2
(45) Date of Patent: May 25, 2010

(54) TEST SWITCHING CIRCUIT FOR A HIGH SPEED DATA INTERFACE

(75) Inventors: Javier Argüelles, München (DE); Otto Schumacher, Dachau (DE)

(73) Assignee: Infineon Technologies AG, Munich (DE)

( * ) Notice: Subject to any disclaimer, the term of this patent is extended or adjusted under 35 U.S.C. 154(b) by 1088 days.

(21) Appl. No.: 10/788,545

(22) Filed: Feb. 27, 2004

(65) Prior Publication Data

US 2005/0193302 A1 Sep. 1, 2005

(51) Int. Cl.
*G01R 31/02* (2006.01)
*G01R 31/26* (2006.01)
(52) U.S. Cl. .................. 324/537; 324/763; 324/769
(58) Field of Classification Search .......... 324/537, 324/763, 769; 714/733; 326/30
See application file for complete search history.

(56) References Cited

U.S. PATENT DOCUMENTS

| 5,197,083 | A | * | 3/1993 | Gandini et al. | ........... 375/225 |
|---|---|---|---|---|---|
| 5,787,114 | A | * | 7/1998 | Ramamurthy et al. | ........ 375/221 |
| 6,590,413 | B1 | * | 7/2003 | Yang | .................. 326/30 |
| 6,731,106 | B2 | * | 5/2004 | Whetsel | .................. 324/158.1 |
| 6,864,704 | B1 | * | 3/2005 | Wong et al. | .................. 326/26 |
| 6,879,131 | B2 | * | 4/2005 | Wong et al. | .................. 320/128 |
| 7,245,144 | B1 | * | 7/2007 | Wong et al. | .................. 326/26 |
| 2005/0146346 | A1 | * | 7/2005 | Kakizawa et al. | ........... 324/763 |
| 2007/0188187 | A1 | * | 8/2007 | Oliva et al. | .................. 326/30 |

* cited by examiner

*Primary Examiner*—Amy He
(74) *Attorney, Agent, or Firm*—Jenkins, Wilson, Taylor & Hunt, P.A.

(57) ABSTRACT

A test switching circuit for a high speed data interface is disclosed. Test switching circuit for a high speed data interface of an integrated circuit including switching transistors which switch in a test mode a termination resistor output stage of a data transmission signal path to a termination resistor input stage of a data reception signal path to form an internal feedback test loop within said integrated circuit.

14 Claims, 13 Drawing Sheets

| CONTROL BITS | NORMAL OPERATION MODE | FEEDBACK TEST MODE | RECEIVER TEST MODE | TRANSMITTER TEST MODE |
|---|---|---|---|---|
| $C_1$ | 0 | 1 | 0 | 1 |
| $C_2$ | 1 | 0 | 0 | 0 |
| $C_3$ | 1 | 0 | 0 | 0 |
| $C_4$ | 0 | 1 | 0 | 1 |
| $C_5$ | 0 | 1 | 1 | 0 |
| $C_6$ | 0 | 1 | 1 | 0 |

FIG. 13

TEST SWITCHING CIRCUIT FOR A HIGH SPEED DATA INTERFACE

This invention refers to a test switching circuit for a high speed data interface of an integrated circuit.

High speed communications circuits sending data rates in the range of 10 Gbps require for testing purposes closed feedback loops. FIG. 1 shows a high speed communication integrated circuit having a core for data processing and several high speed data interfaces. The high speed data interfaces or serialiser deserialiser (SERDES) modules operate at very high data rates up to 10 Gbps. Each high speed data interface (SERDES) is connected to a data transmission line (TX) and a data reception line (Rx). The high speed data interface transmits data via the data transmission line (Tx) and receives data via the data reception line (Rx).

FIG. 2 shows a conventional high speed data interface according to the state of the art. The high speed data interface comprises a transmitter and a receiver. The high speed data interface as shown in FIG. 2 is fully differential. The transmitter comprises a serialiser and an output signal driver which is connected to data output pads (TXN, TXP) of the high speed data interface. The output data pads are connected via a differential data transmission line to a load.

The conventional high speed data interface according to the state of the art further has a receiver comprising a deserialiser and a signal input buffer. The signal input buffer is connected to data input pads (RXP, RXN) to receive data via a differential data reception line. The input of the transmitter and the output of the receiver are connected to the data processing core of the integrated high speed communication circuit.

For testing the high speed data communication circuit it is necessary to test the high speed data interface after manufacturing. This can be done by creating a closed feedback loop connecting the output of the transmitting side to the input of the receiving side. To provide such a test loop in the high speed part of the integrated circuit it is either possible to create an external test loop or an internal test loop within the high-speed communication integrated circuit.

In a conventional external loop arrangement the transmitting output pads TXN, TXP of the differential high speed data interface are connected to the receiver input pads RxN, RxP via an external test equipment to create a test loop. The provision of an external loop has the disadvantage that either multiple test insertions are necessary thus increasing test costs or that in a single test insertion RF-switches have to be employed which increase the complexity of the loading board. In multiple test insertions specific probe cards are designed to provide feedback test loops. Each further test insertion takes time and consequently increases production costs of the chip. In single test insertions the high bandwidth RF-relays may not work reliably for high bandwidth systems and form a source of potential signal integrity problems.

Accordingly the state of the art of high speed data interfaces comprise means for creating an internal test loop. When the feedback loop is created internally of the chip multiplexer and demultiplexer circuits have to be provided within the high speed data interfaces.

FIG. 3 shows a conventional high speed data interface within integrated circuit comprising an internal test loop. The output of the transmitter is connected to a circuit (AMP-DEMUX) which amplifies the output signal of the transmitter by means of an final stage output signal driver and which includes demultiplexing means. For adaptation of the output impedance at the transmission data pad (Tx-PAD) to the load connected via the data transmission line the amplifying-demultiplexing circuit further comprises a programmable termination resistor stage wherein the output impedance is configurable.

A receiver of the high speed data interface is connected at its input side to an integrated circuit (AMP-MUX) which amplifies the received data signal and which comprises multiplexing means. The amplifying and multiplexing circuit comprises a programmable termination resistor stage to adapt the input impedance of the high speed data interface at the receiving data pad (Rx-PAD) to the load connected via the reception data line. The programmable termination resistor stage on the receiving side is configurable to variable loading conditions according to operating requirements of the high speed data interface.

The high speed data interface according to the state of the art as shown in FIG. 3 comprises a multiplexer on the input side of the transmitter and a demultiplexer on the output side of the receiver. The multiplexer and the demultiplexer are controlled by a mode control unit which switches the multiplexer either to a data line or to a test signal generator and the demultiplexer either to an internal data line or to an test signal analyzer. In a normal operation mode of the high speed data interface according to the state of the art as shown in FIG. 3 the multiplexer and demultiplexer connect the internal data lines to the transmitter and receiver. Further the demultiplexer in the output stage connect the predriver to the final stage output signal driver and the multiplexer within the input stage (AMP-MUX) connects the input signal driver to an signal driver within the receiver.

In a test mode the transmitter receives a test data pattern generated by the test signal generator which is fed-back via the demultiplexer in the output stage (AMP-MUX) and the multiplexer within the input stage (AMP-MUX) to the receiver. From the receiver the test data pattern is forwarded by the demultiplexer to the test signal analyzer. The test signal analyzer compares the generated test data pattern with the received test data pattern and determines whether both data pattern are identical. In case that the generated and the received test data pattern are not identical on bit-level an error within the transmitter or receiver is detected.

FIG. 4 shows the output stage (AMP-DEMUX) of a conventional high speed data interface with internal test loops according to the state of the art in more detail.

The predriver is connected to a first differential amplifying stage D-AMP-A which receives a tail current $I_{TAIL}$ from a current mirror circuit. The output of the first differential amplifying stage D-AMP-A is connected via a node N, Ñ to a second differential amplifying stage D-AMP-B and to a third differential amplifying stage D-AMP-C. By means of a mode selection input either the second amplifying stage D-AMP-B or the third amplifying stage D-AMP-C is activated. Accordingly the output signal of the first differential amplifying stage D-AMP-A is either switched to the output of the second differential amplifying stage D-AMP-B or the third amplifying stage D-AMP-C. The output of the second differential amplifying stage D-AMP-B is an internal loop output terminal which is connected to the input stage (AMP-MUX) of the high speed data interface. The output of the third differential amplifying stage D-AMP-C is formed by the data output pads of the high speed data interface (TXN, TXP). The output pads are connected to a programmable termination resistor stage which comprises at least one resistor $R_C$ having a fixed value and at least one switchable resistor $R_C'$ which is switched in parallel to the fixed transistor in response to a configuration bit C stored in a configuration register. In FIG. 4 only one switchable resistor $R_C'$ which is switched in parallel to the fixed transistor in response to a configuration bit C stored in a configuration register is shown. In FIG. 4 only one switchable register $R_C'$ is shown, however a plurality of switchable resisters $R_C'$ can be provided to match the output impedance of the high speed data interface to the load impedance connected via the data transmission line.

FIG. 5 shows the input stage (AMP-MUX) of the conventional high speed data interface according to the state of the art in more detail. The data input pads RXN, RXP are connected with a programmable termination resistor stage of the differential amplifying stage D-AMP-D to the gates of MOSFETs $T_D$, $\overline{T}_D$ via serial resistors $R_S$. The differential amplifying stage D-AMP-D is supplied with a tail current $I_{TAILD}$. The input impedance is configurable by means of configuration bits C, $\overline{C}$ stored in a configuration register. In the embodiment as shown in FIG. 5 only one switchable resistor $R_D'$ is shown, however a plurality of switchable resistors $R_D'$ can be provided to tune the input impedance of the interface to the load connected via the data reception line. The output of the differential amplifying stage D-AMP-D is connected to the input of a further differential amplifying stage D-AMP-E via node M or to the input of a driver within the receiver. The output of the differential amplifying stage D-AMP-E forms an internal loop input terminal to connect the input stage AMP-MUX as shown in FIG. 5 in a test mode to the internal loop output terminal of the output stage AMP-DEMUX as shown in FIG. 4.

Depending on a mode control signal applied to a mode input terminal of the input stage either the differential amplifying stage D-AMP-D or the differential amplifying stage D-AMP-E is activated by supplying a tail current. In a test mode the amplifying stage D-AMP-E receives a tail current and connects the internal loop input terminal via a node M, $\overline{M}$ to the input of the driver within the receiver. In a normal operation mode the differential amplifying stage D-AMP-E is deactivated and the differential amplifying stage D-AMP-D is activated thus connecting the data reception pads RXN, RXP to the input of the driver within the receiver.

The internal test circuit for generating an internal test loop according to the state of the art as shown in FIGS. 3 to 5 has several severe disadvantages.

A first disadvantage is that in the arrangement as shown in FIGS. 3, 4, 5 it is not possible to test whether a final output driver stage, e.g. the differential amplifying stage D-AMP-C in FIG. 4 and the input driver stage on the input side e.g.: the differential amplifier stage D-AMP-D as shown in FIG. 5, do function. When a manufacturing error occurs either at differential amplifier D-AMP-C or in the differential amplifier stage D-AMP-D this will not be detected by the internal test signal analyzer. Further manufacturing errors in the programmable termination resistor stages are not detectable in the high speed data interface circuit according to the state of the art.

A further disadvantage of the conventional circuitry is that by providing an additional differential amplifying stage D-AMP-B at the critical output node N, $\overline{N}$ of the first differential amplifying stage D-AMP-A the parasitic capacitance at this node is increased, (the transistors $T_B$, $\overline{T}_B$ form additional loads to the transistors $T_A$, $\overline{T}_A$) the normal operation mode of the data transmission path via the differential amplifying stage D-AMP-C to the output data pads, which eventually would lead to a normal mode circuit redesign representing an increase of the power dissipation P with regard to the original design in order to maintain the required bandwidth.

Accordingly it is the object of the present invention to provide a test switching circuit for a high speed data interface of an integrated circuit which forms an internal test loop for testing all circuit parts of the high speed data interface and which comprises a less area overhead and minimum power dissipation.

This object can be achieved by a test switching circuit having the features recited by the claims.

The invention provides a test switching circuit for a high speed data interface of an integrated circuit (IC) comprising switching transistors which switch in a test mode a termination resistor output stage of a data transmission line to a termination resistor input stage of a data reception line to form an internal feedback test loop within said integrated circuit (IC).

The test switching circuit according to the present invention has the advantage that a final output driving stage as well as a first driving input stage is also tested by the test switching circuit to detect manufacturing errors in these circuit parts.

The test switching circuit does only comprise switching transistors which act as switches and not signal amplifying transistors like the differential amplifying transistors provided in the conventional output stage as shown in FIG. 4 or in the conventional input stage as shown in FIG. 5. The switching transistors provided within the test switching circuit according to the present invention are much smaller in size than the differential amplifying transistors and are not supplied with a tail current. Consequently the power dissipation P of the test switching circuit according to the present invention is very low.

A further advantage of the test switching circuit according to the present invention having the features recited by the claims is that the data transmission in the normal operation mode is not affected, i.e. the parasitic capacitance is not increased by the test switching circuit according to the present invention.

The internal loop created by the test switching circuit according to the present invention during a test mode covers the complete data path including the termination resistor output stage and the termination resistor input stage.

In a preferred embodiment of the test switching circuit according to the present invention the test switching circuit is connected to a configuration register.

The configuration bits stored in the configuration register control the switching transistors of the test switching circuit.

In a preferred embodiment of the test switching circuit according to the present invention the termination resistor output stage is programmable.

In a further embodiment the termination resistor input stage is also programmable.

In a preferred embodiment both the termination resistor output stage and the termination resistor input stage are connected to a configuration register storing control bits which control transistors connected in series to a corresponding termination resistor of the input or output stage.

Since the termination resistor output stage and the termination resistor input stage are programmable in a preferred embodiment it is possible to adapt the output and input impedance of the high speed data interface to the load connected via the data transmission and the data reception line.

In a preferred embodiment of the test switching circuit according to the present invention the test switching circuit comprises a first transistor connected to the termination resistor output stage of the data transmission line, a second transistor connected between the first transistor and a reference potential node (GND), a third transistor connected between the reference potential node (GND) and a sixth transistor, a fourth transistor connected between said first transistor and a test node, a fifth transistor connected between said test node and said sixth transistor, wherein the sixth transistor is connected to said termination resistor input stage of said data reception line.

In a preferred embodiment the six switching transistors are formed by MOSFETs.

In a preferred embodiment gate terminals of the switching transistors are controlled by control bits stored in the configuration register.

In a preferred embodiment of the controllable test switching circuit according to the present invention in a normal operation mode of the integrated circuit the first transistor is switched off, the second transistor is switched on, the third transistor is switched on, the fourth transistor is switched off, the fifth transistor is switched off and the sixth transistor is switched off.

In a preferred embodiment of the controllable test switching circuit according to the present invention in a feedback test mode of said integrated circuit the first transistor is switched on, the second transistor is switched off, the third transistor is switched off, the fourth transistor is switched on, the fifth transistor is switched on, the sixth transistor is switched on.

In a preferred embodiment of the controllable test switching circuit according to the present invention in a receiver test mode the first transistor is switched off, the second transistor is switched off, the third transistor is switched off, the fourth transistor is switched off, the fifth transistor is switched on and the sixth transistor is switched on.

In a further embodiment of the controllable test switching circuit according to the present invention in a transmitting test mode the first transistor is switched on, the second transistor is switched off, he third transistor is switched off, the fourth transistor is switched on, the fifth transistor is switched off and the sixth transistor is switched off.

In a preferred embodiment of the controllable test switching circuit according to the present invention the test switching circuit is formed differential.

The invention further provides a high speed data interface of an integrated circuit comprising:

(a) a transmitter for transmitting data via a data transmission line which is connected to a termination resistor output stage for adapting the output impedance of said transmitter to a load connected to the transmission data line;

(b) a receiver for receiving data via a data reception line which is connected to a termination resistor input stage for adapting the input impedance of said receiver to a load connected to said data reception line; and (c) a controllable test switching circuit comprising switching transistors switching in a test mode the termination resistor output stage to the termination resistor input stage to form an internal feedback test loop within said integrated circuit.

The invention further provides an integrated circuit having several high speed data interfaces, wherein each high speed data interface comprises a transmitter for transmitting data via a data transmission line, which is connected to a termination resistor output stage for adapting the output impedance of said transmitter to a load connected to the transmission data line, a receiver for receiving data via a data reception line which is connected to a termination resistor input stage for adapting the input impedance of said receiver to a load connected to said reception data line, and a controllable test switching circuit comprising switching transistors switching in a test mode the termination resistor output stage to the termination resistor input stage to form an internal feedback test loop within said integrated circuit.

In the following preferred embodiments the test switching circuit for a high speed data interface within an integrated circuit are described with reference to the enclosed figures.

FIG. 13 shows a table of the configuration bits (C), within a configuration register for controlling the test switching circuit according to the present invention.

Figure 6:
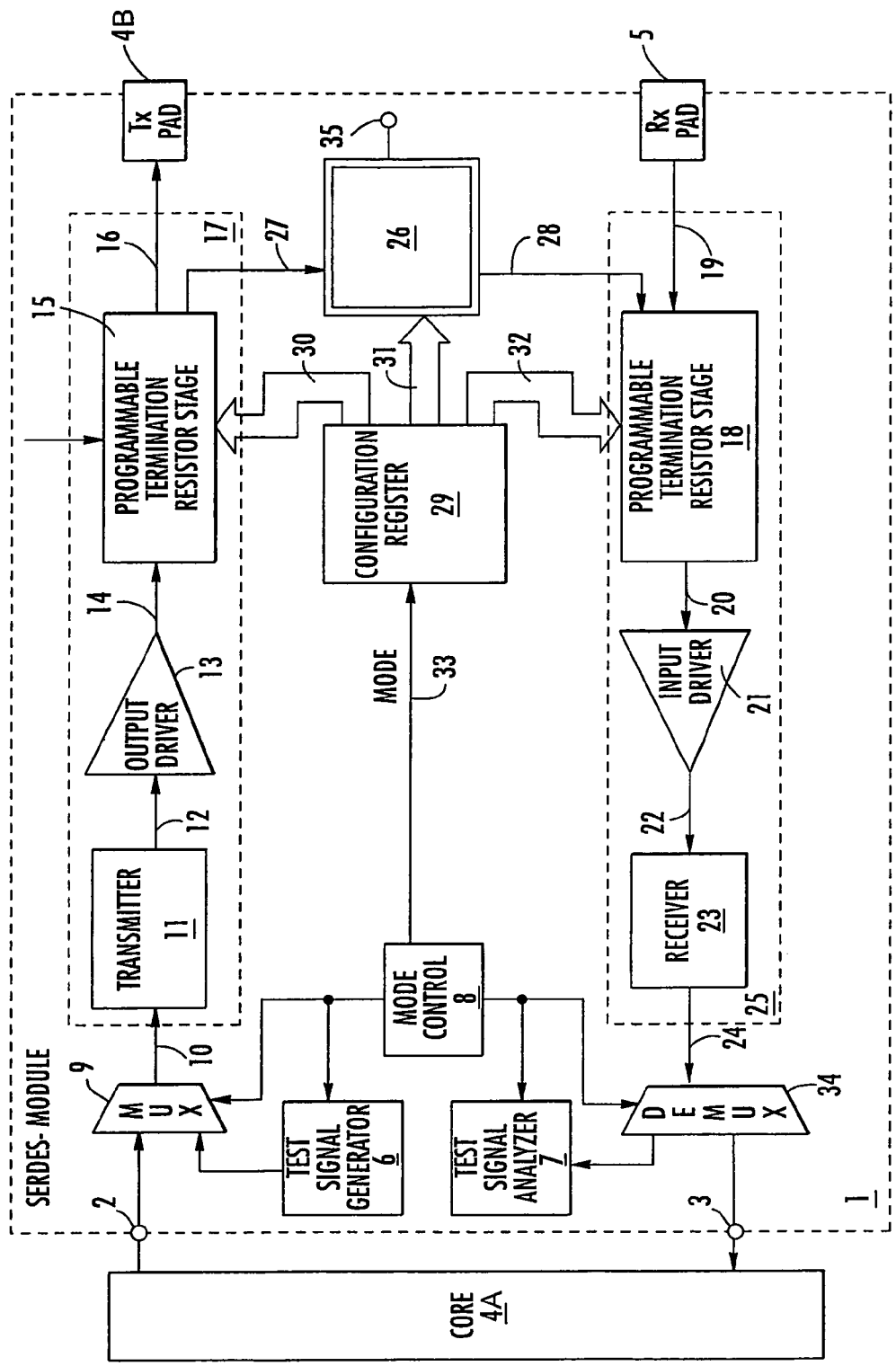
FIG. 6 shows a block diagram of a high speed data interface of an integrated circuit according to the present invention.

As can be seen from FIG. 6 a high speed data interface 1 according to the present invention comprises an internal data input 2 and an internal data output 3 to connect the high speed data interface 1 to a data processing core 4A within an integrated circuit. The integrated circuit comprises several high speed data interfaces 1. Each high speed data interface 1 has a transmission data output pad 4B and a reception data input pad 5 to connect the integrated circuit to an external circuitry. A serial data stream is transmitted via the transmission output pad 4B to the external circuit board and a serial data reception stream is received via the reception data pad 5. In the embodiment as shown in FIG. 6 the high speed data interface 1 comprises a test signal generator 6 and a test signal analyzer 7 which are controlled by a mode control unit 8. In an alternative embodiment the test signal generator 6, the test signal analyzer 7 and the mode control unit 8 are not provided within the high speed data interface 1 but separately within the integrated circuit.

The high speed data interface 1 according to the present invention comprises a data transmission signal path 17 and a data reception signal path 25.

In the data transmission signal path 17, a multiplexer 9 is provided with switches either data output by the data processing core 4A or the test data pattern generated by the test signal generator 6 via an internal line 10 to a transmitter 11 which includes a serialiser and a pre-driving stage for signal amplification. The output of the transmitter 11 is connected via an internal line 12 to a final output driver stage 13 the output of which is connected via an internal line 14 to a programmable termination resistor stage 15. The programmable termination resistor stage 15 is connected via an internal line 16 to the transmission data pad 4B of the integrated circuit. The programmable termination resistor stage 15 comprises a plurality of resistors which are switched by means of transistors to adapt the output impedance of the transmission signal path within the high speed data interface 1 to a load impedance connected to the transmission data pad 4B. The transmitter 11, the output signal driver 13 and the programmable termination resistor stage 15 form a transmission data signal path 17 within the high speed data interface 1.

The high speed data interface 1 further comprises programmable termination resistor stage 18 the input of which is connected via an internal line 19 to the reception data pad 5 of the interface 1. The programmable termination resistor stage 18 is provided for adapting the input impedance of the reception signal path 25 to the load connected to pad 5 via the data reception line. The programmable termination resistor stage 18 is connected via a line 20 to an input signal driver 21 which amplifies the received data signal and outputs the amplified signal via an internal line 22 to a receiver 23 within the interface 1. The receiver 23 includes a further signal driving stage and a deserialiser. The output of the receiver 23 is connected via an internal line 24 to a demultiplexer 34 controlled by the mode control unit 8. The programmable termination resistor stage 18, the input driver 21 and the receiver 23 form the data reception signal path 25 within the high speed data interface 1.

The high speed data interface 1 according to the present invention as shown in FIG. 6 comprises a test switching circuit 26 which switches in a test mode the termination resistor stage 15 of the transmission signal path 17 to the termination resistor input stage 18 of the data reception signal path 25 to form an internal feedback test loop within said integrated circuit.

As can be seen from FIG. 6 the test switching circuit 26 according to the present invention is connected via a line 27 to the programmable termination resistor stage 15 and via a line 28 to the programmable termination resistor stage 18.

The programmable termination resistor output stage 5, the programmable termination resistor input stage 18 and the test switching circuit 26 are connected to a configuration register 29 within the high speed data interface 1. The configuration register 29 stores control bits which are applied via control lines 30 to the programmable termination resistor output stage 5, via control lines 31 to the test switching circuit 26 and via control lines 32 to the programmable termination resistor input stage 18. The configuration register 29 stores several sets of configuration bits which are switched in response to a control mode signal applied to the configuration register 29 via control lines 33. The mode control unit 8 controls the operation mode of the configuration register 29 which applies different sets of configuration bits to the termination resistor stages 15, 18 and the test switching circuit 26.

In a preferred embodiment of the high speed data interface 1 according to the present invention the test switching circuit 26 is switchable between four different modes.

In a normal operation model the programmable termination resistor output stage 15 is separated from the programmable termination resistor input stage 18 by the test switching circuit 26. The multiplexer 9 switches the data processing core 4A of the integrated circuit to the data transmission signal path 17 and the demultiplexer 34 switches the output of the data reception signal path 25 to the data processing core 4A of the integrated circuit. In the normal operation mode no test is performed and the data output by the core 4A is transmitted via the transmission signal path 4B to the external circuitry. In the same manner data received via the data reception pad 5 is forwarded by the data reception signal path 25 to the data processing core 4A of the integrated circuit.

Figure 1:
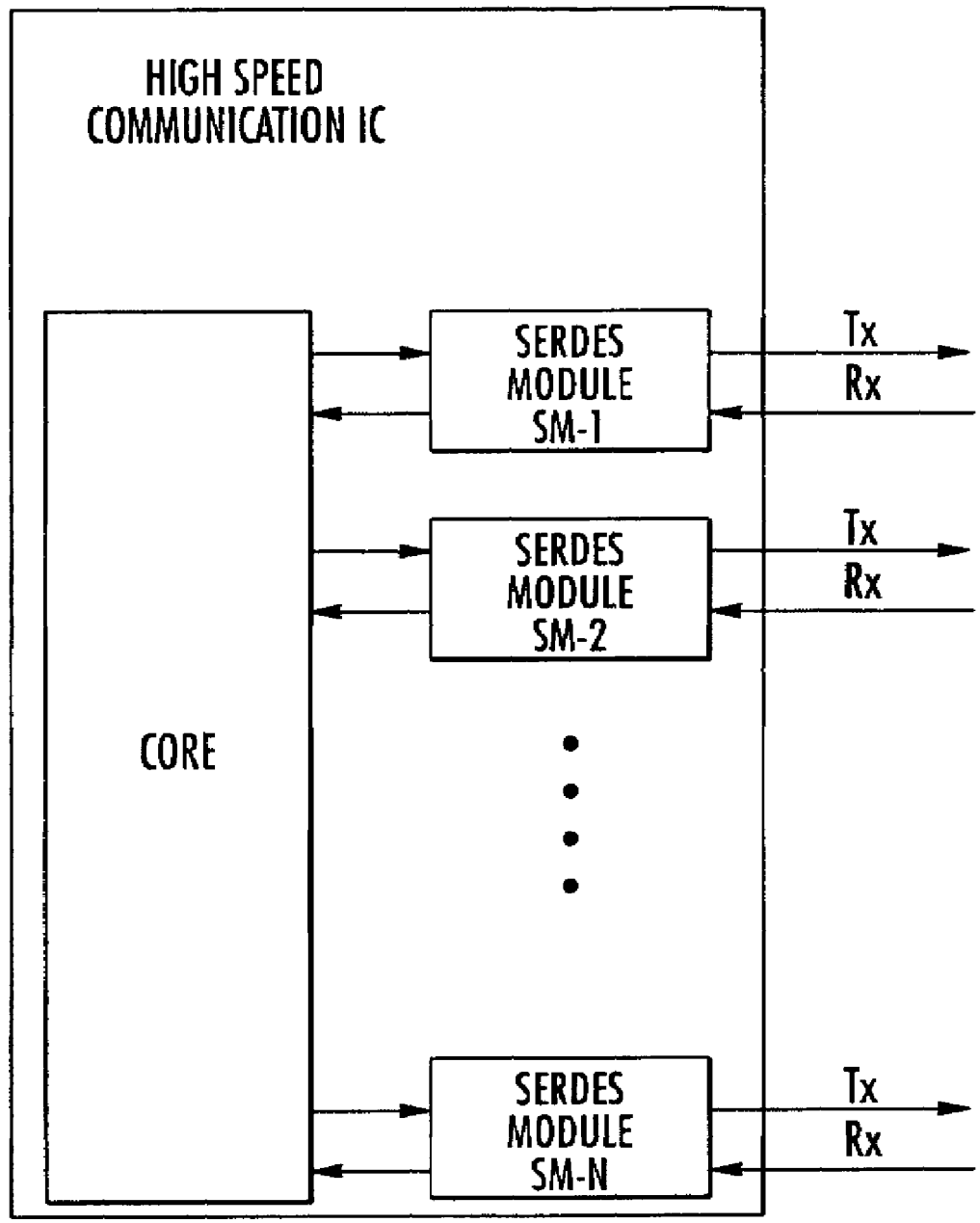
FIG. 1 shows a high speed communication integrated circuit according to the state of the art.
Figure 2:
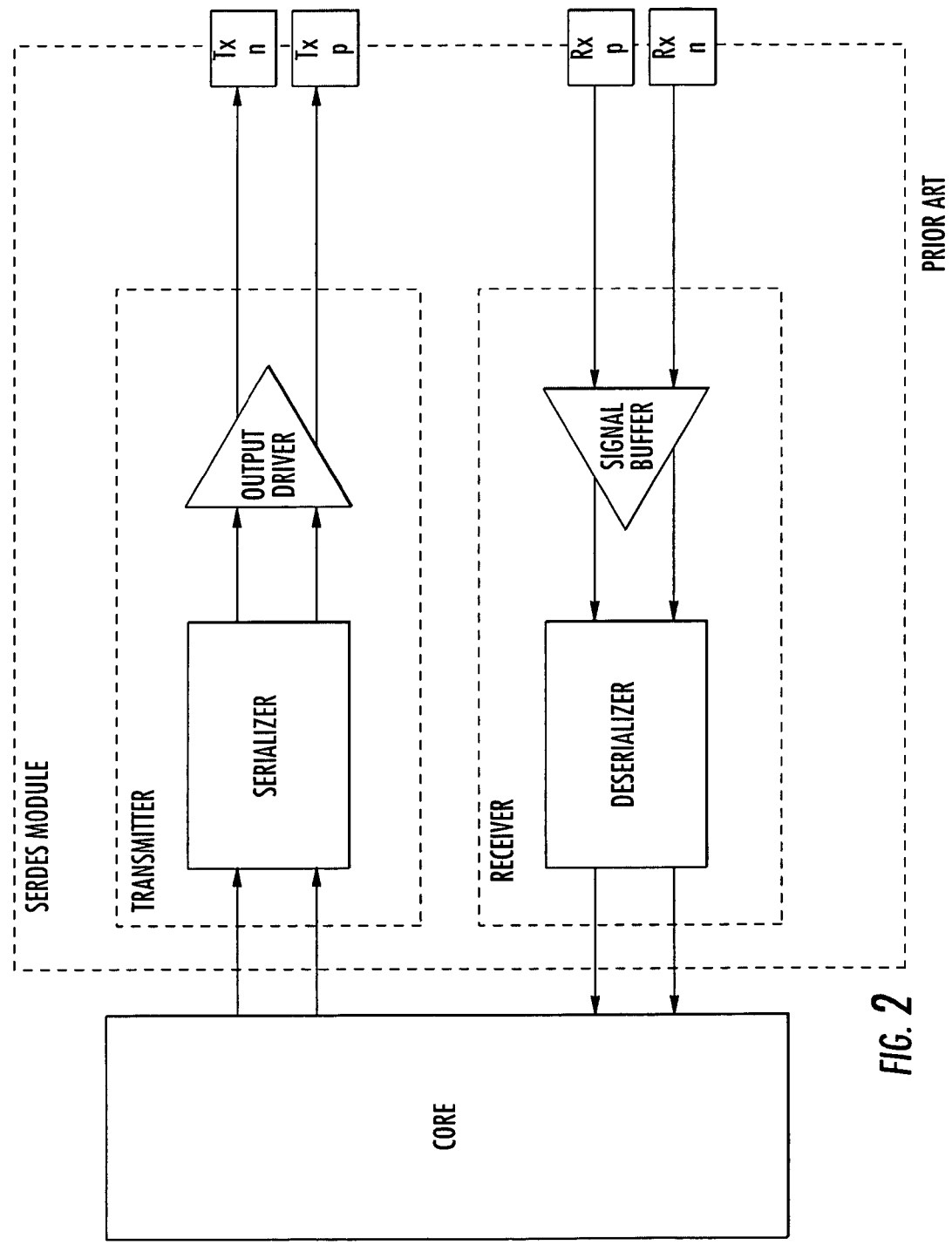
FIG. 2 shows a conventional high speed data interface according to the state of the art.
Figure 3:
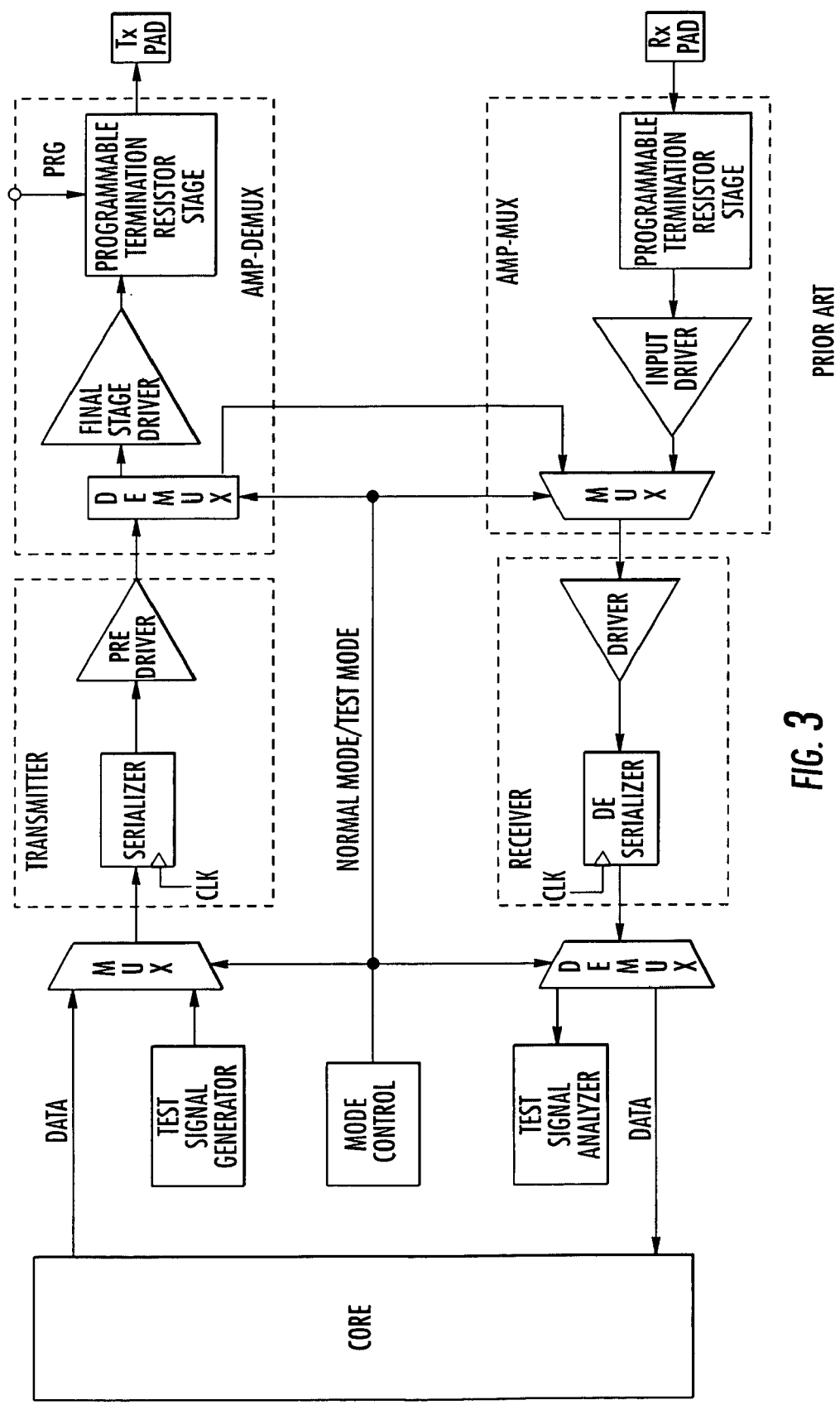
FIG. 3 shows a conventional high speed data interface with an internal test loop according to the state of the art.
Figure 4:
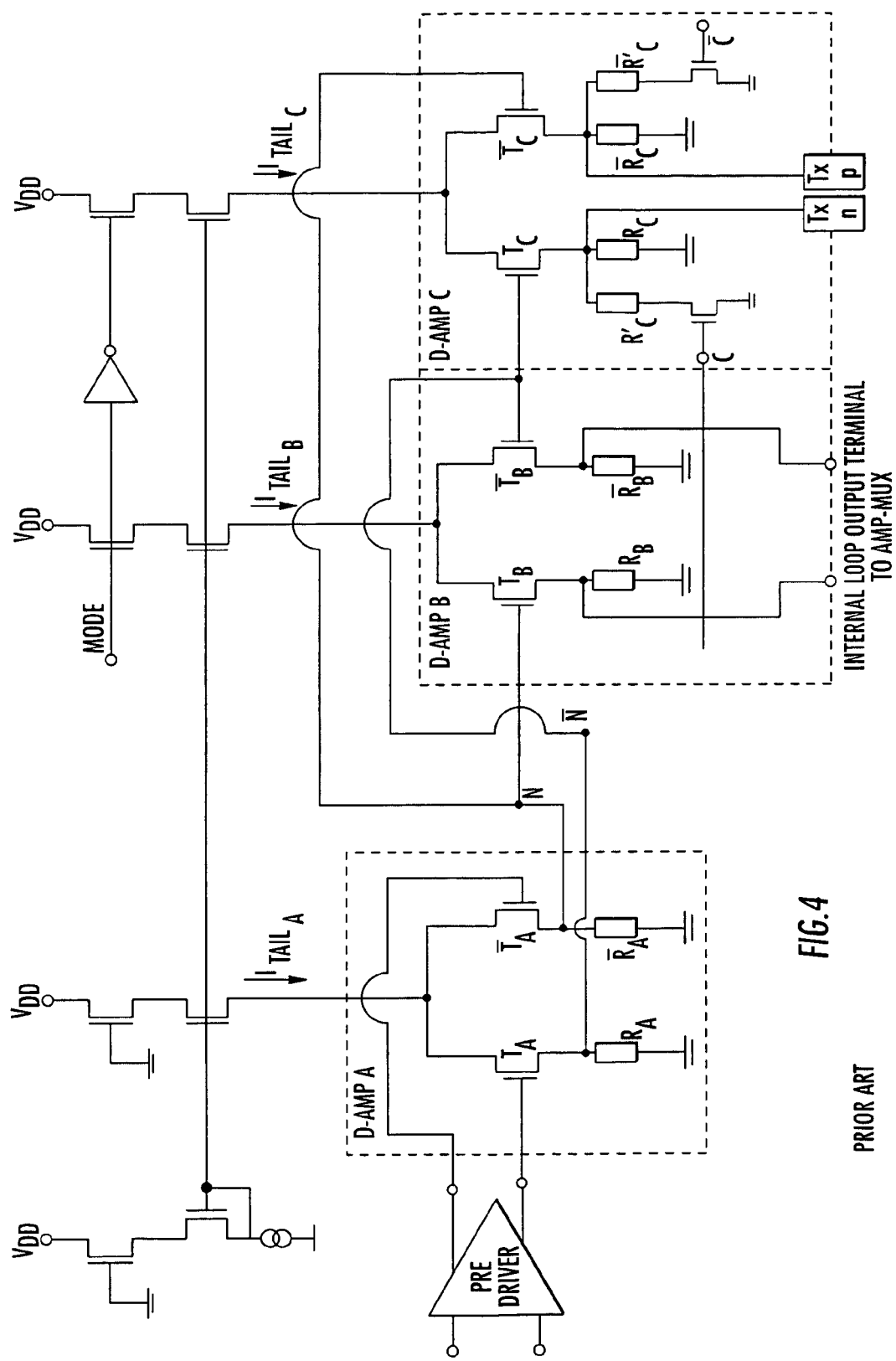
FIG. 4 shows the output stage of a conventional high speed data interface according to the state of the art.
Figure 5:
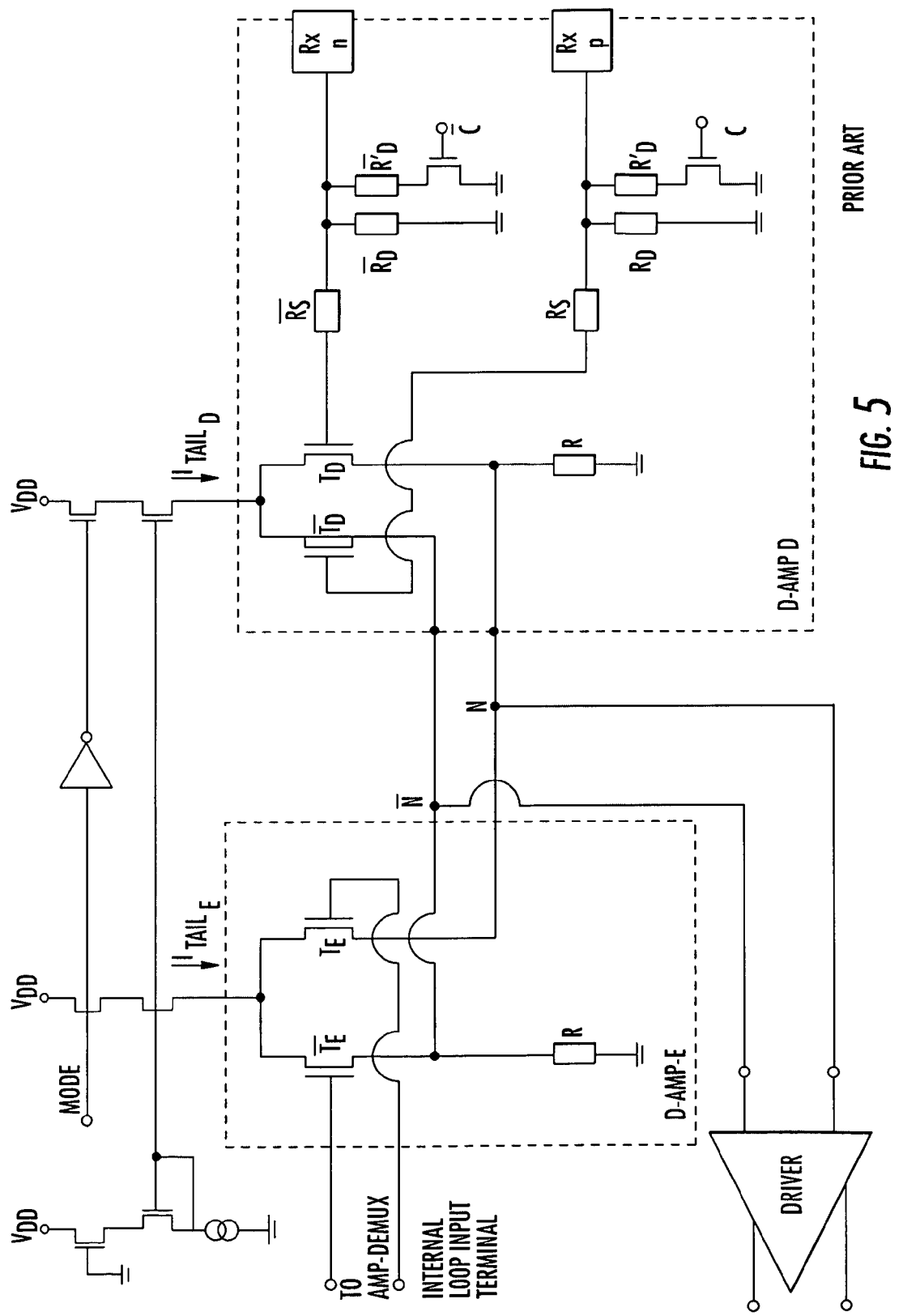
FIG. 5 shows the input stage of a conventional high speed data interface according to the state of the art.

In a feedback test mode of the high speed data interface 1 according to the present invention the test switching circuit 26 switches the output line 27 of the programmable termination resistor stage 15 via line 28 to the input of the programmable termination resistor input stage 18 thus creating an internal test loop within the data interface 1. The mode control unit 8 switches by means of multiplexer 9 the output of the test signal generator 6 to the input of the data transmission signal path 17. Further demultiplexer 34 switches the output of the data reception signal path 25 to the input of the test signal analyzer 7. The test pattern generated by the test signal generator 6 is transmitted by the data transmission path 15 via line 27 to the test switching circuit 26 which forwards the received test data pattern via line 28 to the data reception signal path 25. From the data reception signal path 25 the test data pattern is applied via demultiplexer 34 to the input of the test signal analyzer 7. The test signal generator 6, the multiplexer 9, the data transmission path 17, the test switching circuit 26, the data reception path 25, the demultiplexer 34 and the test signal analyzer 7 form an internal test loop in the high speed data interface 1. The test signal analyzer 7 compares the received test data pattern with the test data pattern generated by the test signal generator 6 and detects an error when both test data patterns are different. The test loop generated by the test switching 26 according to the present invention includes the final signal output driver stage 13, the programmable output termination resistor stage 5, the programmable termination resistor input stage 18 and the first signal input driver stage 21 of the high speed data interface 1. Accordingly the test loop generated by the test switching circuit 26 according to the present invention includes the complete circuitry of the high speed data interface 1, i.e. also the circuit parts which are connected directly to the data pads 4, 5 of the interface circuit 1. In contrast to the testable high speed data interface according to the state of the art as shown in FIG. 3 with the test loop provided by the test switching circuit 26 it is also possible to test the circuitry of the output driver 13, the programmable termination resistor output switch 5, the programmable termination resistor input stage 18 and the input driver 21.

In a third operation mode, i.e. a receiver test mode, the test switching circuit 26 according to the present invention switches the data reception signal path 25 of the interface 1 to an internal test point. The test point 35 is connected in a preferred embodiment for a built in self test circuitry (BIST) forming a further test loop via the data processing core 4A and the data reception signal path 25 of the high speed data interface 1. In this receiver test mode it is possible to test the functionality of the data reception signal path 25 separately.

In a further test mode, i.e. a transmitter test mode, the test switching circuit 26 switches the data transmission signal path 17 to the test point 25 closing another test loop by means of a built in self test circuitry, wherein these test loop includes the data transmission signal path 17. In the transmitter test mode it is possible to test the functionality of the data transmission signal path 17 separately.

The feedback loops created by the test switching circuit 26 according to the present invention are created close to the data pads 4, 5, and involve all active signal blocks in the data transmission and data reception signal propagation pathes 17, 25.

During the normal operation mode the test switching circuit separates the data transmission signal path 17 and the data reception signal path 25 completely, so that crosstalk is minimized.

Figure 7:
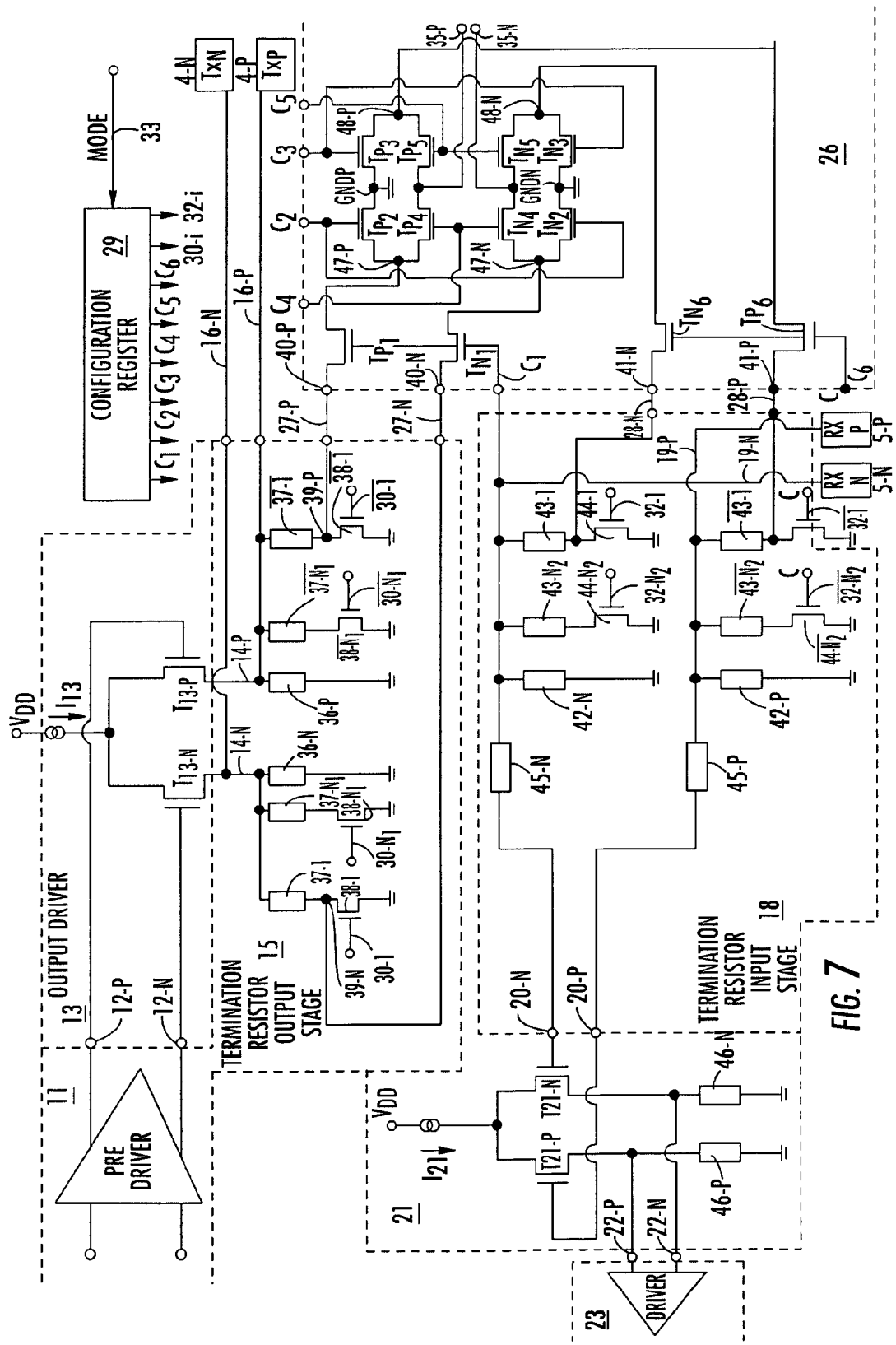
FIG. 7 shows a preferred embodiment of a test switching circuit for creating an internal test loop within a high speed data interface according to the present invention.

FIG. 7 shows a preferred embodiment of the test switching circuit 26 in detail. In the embodiment shown in FIG. 7 the high speed data interface 1 according to the present invention is formed fully differential.

The predriver within the transmitter 11 outputs a preamplified output data signal to the line output driver stage 13 via the differential signal lines 12-P, 12-N to the gate terminals of transistors T13-N, T13-P within the output driver stage 13. The transistor T13-N, T13-P are both connected to a current source 113 which applies a tail current to the differential amplifying stage. The output driver 13 is connected via lines 14-N, 14-P to a termination resistor output stage 15. The termination resistor output stage 15 comprises resistors 36-N, 36-P having a fixed resistance and resistors 37-i which are activated by means of transistors 38-i. The gates of the MOSFET transistors 38 are connected via control lines 30-i to the configuration register 29. The programmable termination resistor output stage 15 is connected via an internal output line 16-N, 16-P to the transmission data pads 4-N, 4-P of the high speed data interface 1. The termination resistor output stage 15 is provided for adapting the output impedance of the data transmission signal path 17 to the load impedance connected to the high speed data interface via pads 4-N, 4-P. At nodes 39-N and 39-P the termination resistor output stage 15 is connected via lines 27-P, 27-N to transmission input terminals 40-N, 40-P of the test switching circuit 26 according to the present invention.

The test switching circuit 26 further comprises reception input terminals 41-P, 41-N for connecting a test switching circuit 26 to the termination resistor input stage 18 via lines 28-N, 28-P. The termination resistor input stage 18 comprises resistors 42-N and 42-P having fixed resistor values and several resistors 43-i which are activated by means of transistors 44-i. The gates of the transistors 44-i are connected via control lines 32-i to the configuration register 29. The resistors are configurated to match the impedance of the load connected to the reception line data pads 5-N, 5-P which are connected to the termination resistor input stage 18 via internal input lines 19-N, 19-P. The input data lines 19-P, 19-N are connected to the output lines 20-N, 20-P via serial resistors 45-N, 45-P. The termination resistor input stage 18 is connected on its output side to the input driver 21 comprising a differential amplifying stage formed by two transistors T21-N, T21-P. The gate of transistor 21-N is connected to line 20-N and the gate of transistor 21-P is connected to output 20-P of the termination resistor input stage 18. Both transistors 21-P, 21-N receive a tail current I21 generated by a current source. The transistors 21-P, 21-N are connected via resistors 46-N, 46-P to ground and via signal lines 22-P, 22-N to the input of a driver within receiver 23.

The test switching circuit 26 according to the present invention is provided for generating test loops for testing whether the high speed data interface 1 works correctly. In a preferred embodiment the test switching circuit 26 comprises six control inputs C1, C2, C3, C4, C5, C6 which are connected to the configuration register 29. The test switching circuit 26 as shown in FIG. 7 is fully differential. It comprises six pairs of transistors T1 to T6, i.e. twelve transistors. The transistors provided within the test switching circuit 26 according to the present invention are switching transistors and do not have any amplifying functions. Accordingly the size of the twelve transistors provided within the test switching circuit 26 according to the present invention is small. The switching transistors T1 to T6 used in the test switching circuit 26 do not receive any tail currents so that the power dissipation of the test switching circuit 26 is very low and only during switching operation a small power consumption occurs.

The test switching circuit 26 comprises six pairs of controllable switching transistors T1 to T6. In a preferred embodiment as shown in FIG. 7 the switching transistors are formed by MOSFET transistors. The first pair of switching transistors TP1, TN1 (T1) is controlled by a first configuration bit C1 of the configuration register 29 and switches the termination resistor output stage 15 to nodes 47-N, 47-P within the switching circuit 26 when the control bit C1 is high. In the same manners the sixth pair of switching transistors TN6, TP6 (T6) switch the input 28-N, 28-P to the termination resistor input stage 18 to nodes 48-P, 48-N when the corresponding control bit C6 is logical high.

The gates of the second pair of transistors TN2, TP2 (T2) receive the control bit C2 of the configuration bit and switches nodes 47-P, 47-N to a reference potential GND-P, GND-N if the configuration bit C2 is logical high.

The gates of the third pair of transistors TN3, TP3 (T3) receive a third configuration bit C3 of the configuration register 29. If the configuration of C3 is high the transistors TP3, TN3 (T3), connect the nodes 48-P, 48-N to GNDP and GNDN.

The gates of fourth pairs of transistors TP4, TN4 (T4) receive a fourth configuration bit C4. In case that the fourth control configuration bit C4 is logical high nodes 47-P, 47-N are connected to test point nodes 35-N, 35-P.

A fifth pair of transistors TN5, TP5 (T5) is controlled by a fifth configuration bit (5) of the configuration register 29 and connects the test points 35-N, 35-P to nodes 48-P, 48-N when the fifth configuration bit C5 is logical high.

By applying different combinations of configuration bits C1 to C6 it is possible to operate the high speed interface 1 according to the present invention in different modes as explained with reference to FIGS. 8 to 11.

Figure 8:
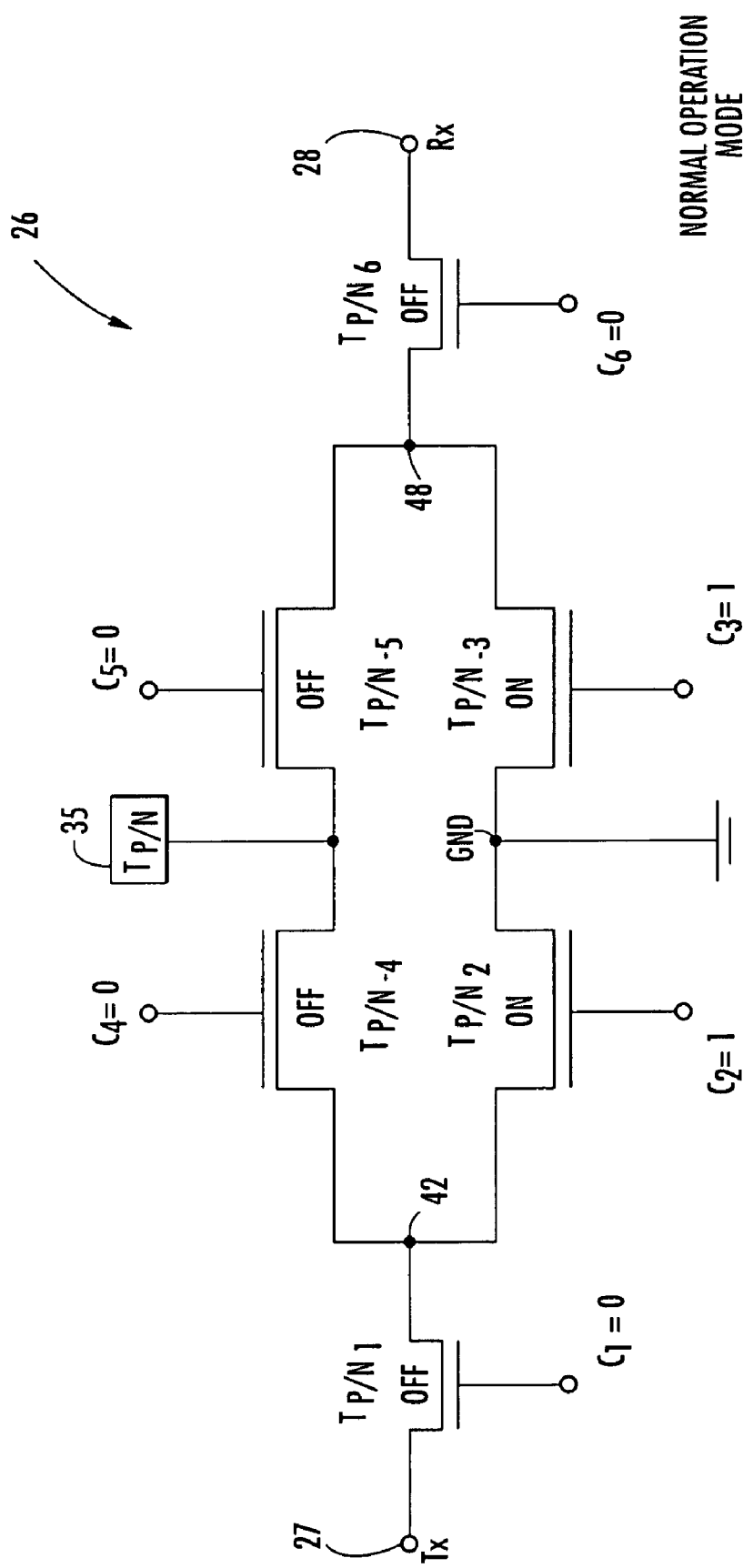
FIG. 8 shows a test switching circuit according to the present invention in a normal operation mode.

As can be seen in FIG. 8 in the normal operation mode of the interface 1 the test switching circuit 26 separates the data transmission signal path 17 from the data transmission signal path 25 completely by switching off transistors T1, T6. Accordingly the configuration bits C1, C6 within the configuration register 29 are low. At the same time the resistor pairs T2, T3 are switches through thus connecting transistors T1, T6 to ground. By means of transistors T2, T3 any leakage currents which pass through T1, T6 are drawn to ground potential to minimize crosstalk between the data transmission path 17 and the data reception path 25. In the normal operation mode the transistor pairs T4, T5 are shut off to isolate test point 35.

Figure 9:
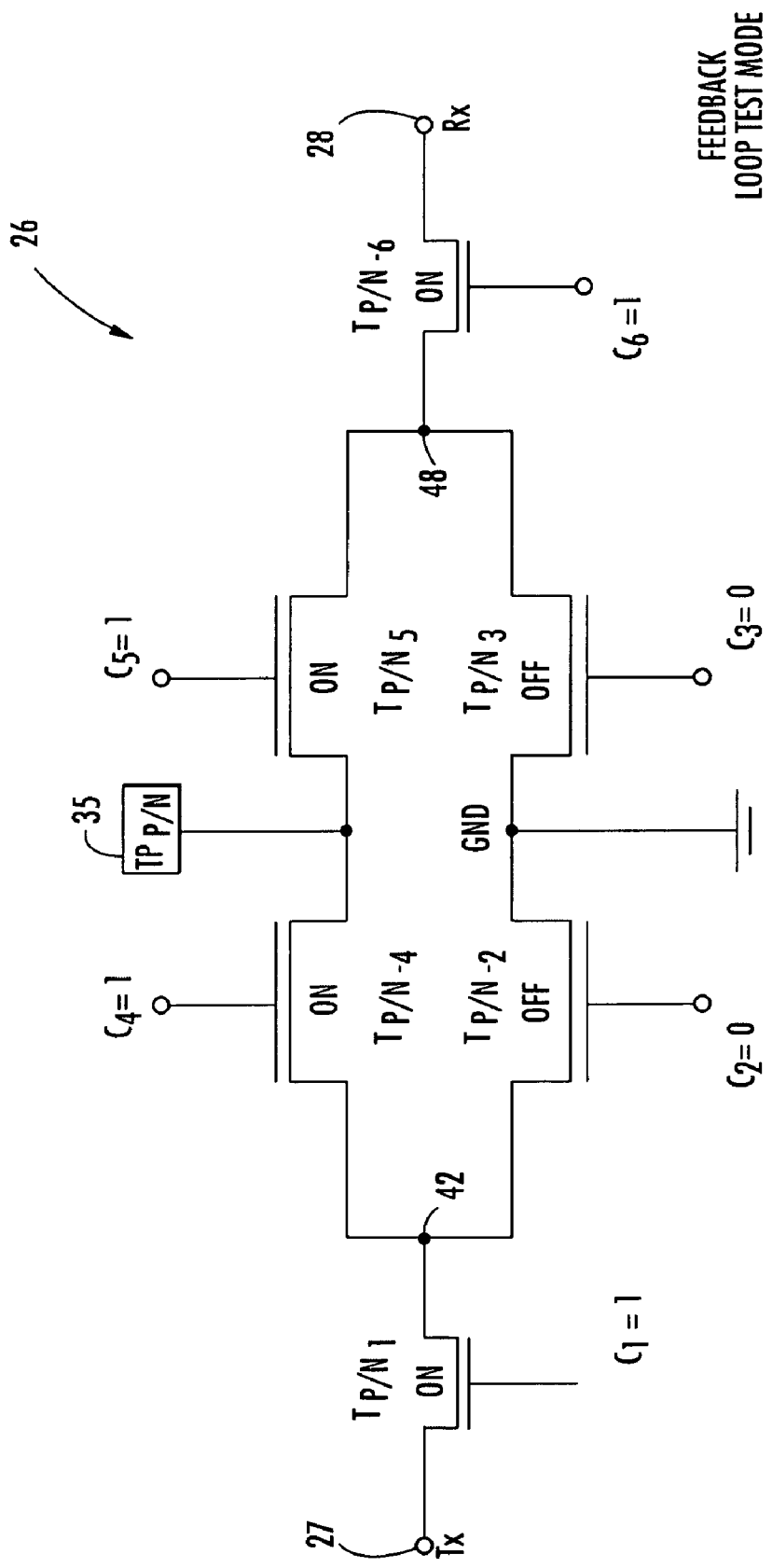
FIG. 9 shows a test switching circuit according to the present invention in a feedback loop test mode.

FIG. 9 shows the test switching circuit 26 in a feedback loop test mode. In the feedback loop test mode the data transmission path 17 is switched to the data transmission reception path 25 via the lines 27 and lines 28. For the short cut transistor pairs T1, T4, T5, T6 are switched through by high configuration bits C1, C4, C5, C6. At the same time resistor pairs T2, T3 are switched off, i.e. C2 and C3 are low.

Figure 10:
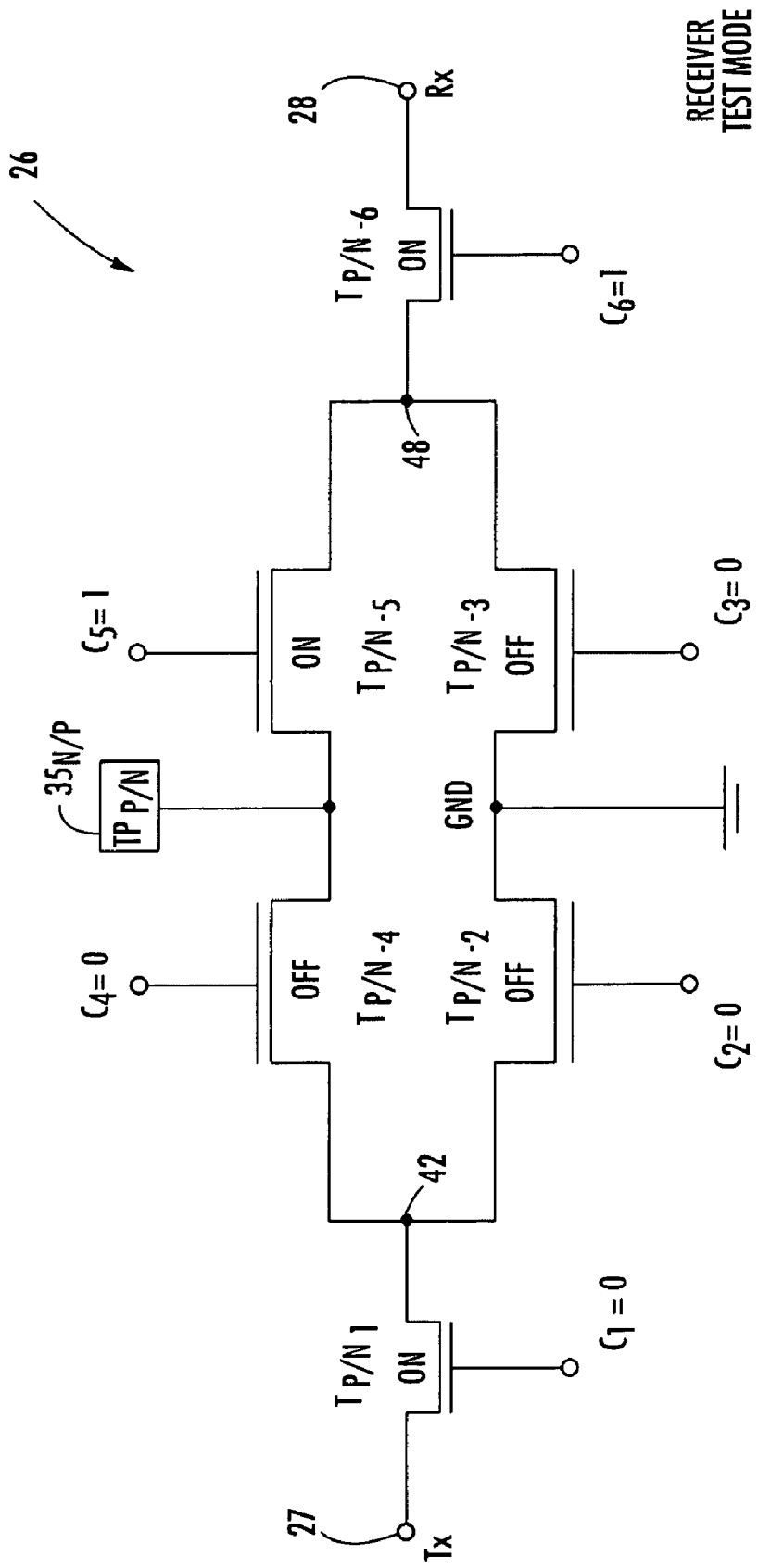
FIG. 10 shows a test switching circuit according to the present invention in a receiver test mode.

FIG. 10 shows the switching circuit 26 according to the present invention in a receiver test mode. In the receiver test mode the fifth and sixth resistor pair T5, T6 are switched on to connect the data reception path 25 of the data interface 1 to an internal test point 35. The remaining resistor pairs T1, T2, T3, T4 are switched off. The test point 35 is connected to a built in self test logic within an integrated circuit to close a further test loop which allows to test the data reception signal path 25 separately.

Figure 11:
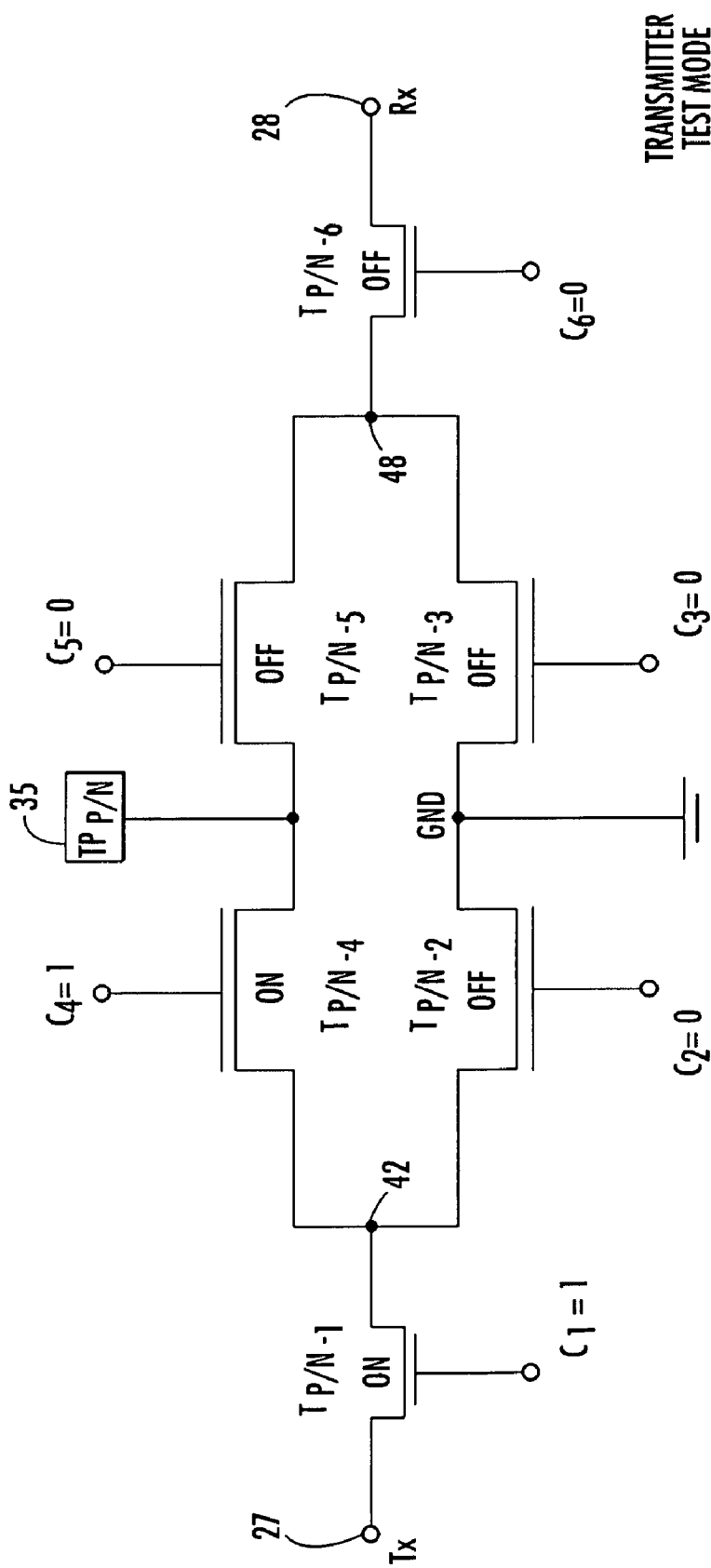
FIG. 11 shows a test switching circuit according to the present invention in a transmitter test mode.

FIG. 11 shows the test switching circuit 26 according to the present invention in a transmitter test mode. In this test mode the first and fourth transistor pair T1, T4 are switched on to connect the transmitter to the internal test point 35 whereas the remaining transistor pairs T2, T3, T5, T6 are switched off. In the transmitter test mode the transmitting signal path 17 of the high speed data interface 1 according to the present invention is tested via the internal built in self test circuit connected to test point 35.

The test switching circuit 26 according to the present invention allows four different operation modes. FIG. 13 shows the configuration control bits C1 stored in the configuration register 29 for the different operation modes which are selected via the control line 33 by the mode control 8.

Figure 12:
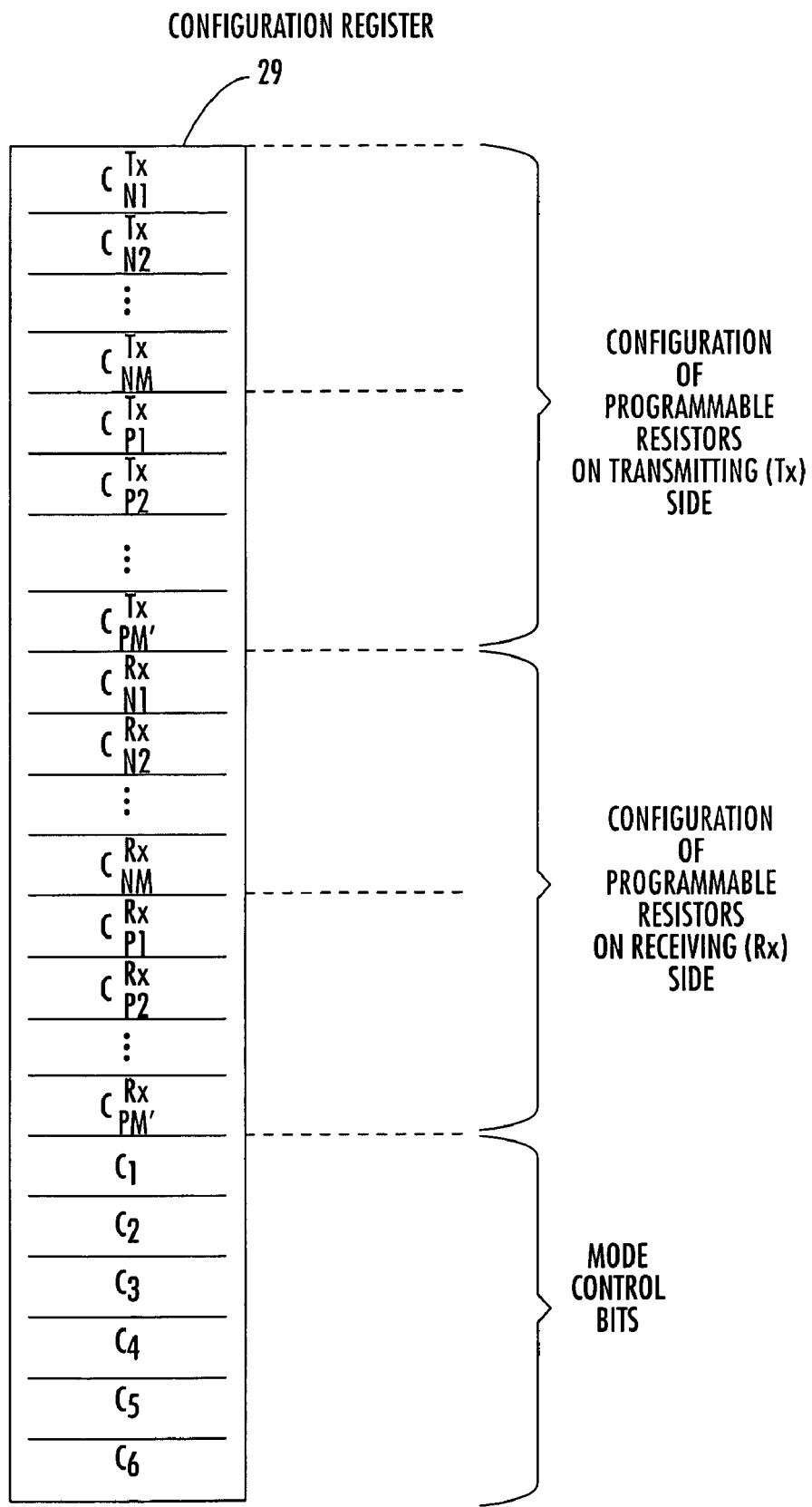
FIG. 12 shows the data content of the configuration register provided within high speed data interface according to the present invention.

FIG. 12 shows the data content of the configuration register 29 in a preferred embodiment of the high speed data interface 1 according to the present invention. The configuration register 29 includes the configuration bits of the configuration of the programmable resistor output stage 15, the configuration bits for the programmable termination resistor input stage 18 and the control bits C1 to C6 for controlling the test switching circuit 26 according to the present invention.

The test switching circuit 26 is provided as close as possible to the transmission pads 4-N, 4-P and the receiving data pads 5-N, 5-P of the interface 1. The test switching circuit 26 is connected to the termination resistor stages 15, 18 so that it is possible to test the functionality of these termination resistor stages 15, 18 in a internal feedback test loop.

In the normal operation mode the test switching circuit 26 according to the present invention has no impact on the load capacitance on the data transmission line and the data reception lines.

The bandwidth of the high speed data interface is not reduced and the power consumption of the test switching circuit 26 according to the present invention is minimal since only switching transistors are provided having a small size and a minimal current consumption.

In the normal operation mode crosstalk between the transmitting signal path 17 and the receiving signal path 15 is minimized by shutting off transistor pairs T1, T6 and by drawing possible leakage currents and noise to ground potential.

The test switching circuit 26 does not affect the loading conditions of the involved amplifying stages and therefore the bandwidth of the high speed data interface 1 is not compromised.

REFERENCE LIST 1 high speed data transmission interface
2 data input
3 data output
4 date transmission output pad
5 data reception input pad
6 test signal generator
7 test signal analyzer
8 mode control unit
9 multiplexer
10 line
11 transmitter
12 line
13 output driver
14 line
15 programmable termination resistor output stage
16 line
17 data transmission signal path
18 programmable termination resistor input stage
19 line
20 line
21 input driver
22 line
23 receiver
24 line
25 data reception signal path
26 test switching circuit
27 lines
28 lines
29 configuration register
30 configuration lines
31 configuration lines
32 configuration lines
33 mode control lines
34 demultiplexer
25 test points
36 resistor
37 resistor
38 transistors
39 nodes
40 terminal
41 terminal
42 resistors
43 resistors
44 transistors
45 resistors
46 resistors
47 nodes
48 nodes

The invention claimed is:

1. Test switching circuit for a high speed data interface of an integrated circuit comprising:
a plurality of switching transistors which switch in a test mode an integrated termination resistor output stage to an integrated termination resistor input stage, said output stage being coupled to an output pad of said integrated circuit in a data transmission signal path, and said input stage being coupled to an input pad of said integrated circuit in a data reception signal path,
wherein said plurality of switching transistors are switchable and provide a plurality of different internal test signal paths within the test switching circuit between said input pad and said output pad corresponding to a plurality of test operation modes.

2. The test switching circuit according to claim 1 wherein the test switching circuit is connected to a configuration register.

3. The test switching circuit according to claim 1 wherein the integrated termination resistor output stage is programmable.

4. The test switching circuit according to claim 1 wherein the integrated termination resistor input stage is programmable.

5. Test switching circuit for a high speed data interface of an integrated circuit comprising switching transistors which switch in a test mode a termination resistor output stage of a data transmission signal path to a termination resistor input stage of a data reception signal path to form an internal feedback test loop within said integrated circuit, wherein the controllable test switching circuit comprises:
a first transistor connected to said termination resistor output stage of the data transmission signal path;
a second transistor connected between said first transistor and a reference potential node;
a third transistor connected between said reference potential node and a sixth transistor;

a fourth transistor connected between said first transistor and a test node;

a fifth transistor connected between said test node and said sixth transistor;

wherein the sixth transistor is connected to said termination resistor input stage of the data reception signal path.

6. The test switching circuit according to claim 5 wherein the transistors are formed by MOSFETs.

7. The test switching circuit according to claim 6 wherein the gate terminals of the transistors are controlled by control bits stored in said configuration register.

8. The test switching circuit according to claim 5 wherein in a normal operation mode of said integrated circuit the first transistor is switched off, the second transistor is switched on, the third transistor is switched on, the fourth transistor is switched off, the fifth transistor is switched off and the sixth transistor is switched off.

9. The test switching circuit according to claim 5 wherein in a feedback test mode of said integrated circuit the first transistor is switched on, the second transistor is switched off, the third transistor is switched off, the fourth transistor is switched on, the fifth transistor is switched on and the sixth transistor is switched on.

10. The test switching circuit according to claim 5 wherein in a receiver test mode of said integrated circuit the first transistor is switched off, the second transistor is switched off, the third transistor is switched off, the fourth transistor is switched off, the fifth transistor is switched on and the sixth transistor is switched on.

11. The test switching circuit according to claim 5 wherein in a transmitter test mode of said integrated circuit the first transistor is switched on, the second transistor is switched off, the third transistor is switched off, the fourth transistor is switched on, the fifth transistor is switched off and the sixth transistor is switched off.

12. The test switching circuit according to claim 5 wherein the controllable test switching circuit is fully differential.

13. A high speed data interface within an integrated circuit comprising:

(a) a transmitting signal path for transmitting data via a data transmission line which is connected through an output pad to an integrated termination resistor output stage coupled to the output pad in said data transmission signal path, wherein the integrated termination resistor output stage is provided for adapting the output impedance of said data transmission signal path to a load connected to said transmission data line through the output pad;

(b) a reception data signal path for receiving data via a data reception line, which is connected through an input pad to an integrated termination resistor input stage coupled to the input pad in said data reception signal path, wherein the integrated termination resistor input stage is provided for adapting the input impedance of said data reception signal path to a load connected to said reception data line through the input pad; and (c) a controllable test switching circuit comprising a plurality of switching transistors for switching in a test mode the integrated termination resistor output stage to the integrated termination resistor input stage to form an internal feedback test loop within said integrated circuit, wherein said plurality of switching transistors are switchable and provide a plurality of different internal test signal paths within the test switching circuit between said input pad and said output pad corresponding to a plurality of test operation modes.

14. Integrated circuit having several high speed data interfaces, wherein each high speed data interface comprises:

(a) a transmitting signal path for transmitting data via a data transmission line which is connected through an output pad of said integrated circuit to an integrated termination resistor output stage coupled to the output pad in said data transmission signal path, wherein the termination resistor output stage is provided for adapting the output impedance of said data transmission signal path to a load connected to said transmission data line through the output pad;

(b) a reception data signal path for receiving data via a data reception line, which is connected through an input pad of said integrated circuit to an integrated termination resistor input stage coupled to the input pad in said data reception signal path, wherein the integrated termination resistor input stage is provided for adapting the input impedance of said data reception signal path to a load connected to said reception data line through the input pad; and (c) a controllable test switching circuit comprising a plurality of switching transistors for switching in a test mode the integrated termination resistor output stage to the integrated termination resistor input stage to form an internal feedback test loop within said integrated circuit, wherein said plurality of switching transistors are switchable and provide a plurality of different internal test signal paths within the test switching circuit between said input pad and said output pad corresponding to a plurality of test operation modes.

* * * * *